United States Patent
Torma et al.

(10) Patent No.: US 10,483,079 B2
(45) Date of Patent: Nov. 19, 2019

(54) METHOD FOR MANUFACTURING RADIATION WINDOW AND A RADIATION WINDOW

(71) Applicant: HS Folis Oy, Espoo (FI)

(72) Inventors: Pekka Torma, Espoo (FI); Heikki Johannes Sipila, Espoo (FI)

(73) Assignee: HS FOILS OY, Espoo (FI)

( * ) Notice: Subject to any disclaimer, the term of this patent is extended or adjusted under 35 U.S.C. 154(b) by 130 days.

(21) Appl. No.: 15/361,186

(22) Filed: Nov. 25, 2016

(65) Prior Publication Data

US 2017/0154749 A1 Jun. 1, 2017

(30) Foreign Application Priority Data

Nov. 26, 2015 (FI) ..................... 20155881

(51) Int. Cl.
*H01J 35/18* (2006.01)
*H01J 5/18* (2006.01)
(Continued)

(52) U.S. Cl.
CPC ............ *H01J 35/18* (2013.01); *B23K 1/0008* (2013.01); *B23K 35/26* (2013.01);
(Continued)

(58) Field of Classification Search
CPC ...... H05G 1/00; H05G 1/02; G01N 2223/317; H01J 5/00; H01J 5/02; H01J 5/18; H01J 19/54; H01J 19/57; H01J 33/00; H01J 33/02; H01J 33/04; H01J 35/00; H01J 35/02; H01J 35/16; H01J 35/18; H01J 37/00; H01J 37/02; H01J 37/16; H01J 37/165; H01J 2235/00; H01J 2235/18;
(Continued)

(56) References Cited

U.S. PATENT DOCUMENTS

| 4,468,282 A | 8/1984 | Neukermans |
| 4,536,882 A | 8/1985 | Jones et al. |

(Continued)

FOREIGN PATENT DOCUMENTS

| DE | 102006048609 | 4/2007 |
| JP | H0353200 A | 3/1991 |

(Continued)

OTHER PUBLICATIONS

FI Search Report, dated Mar. 30, 2016, from corresponding FI application.
(Continued)

*Primary Examiner* — Anastasia Midkiff
(74) *Attorney, Agent, or Firm* — Young & Thompson

(57) ABSTRACT

For manufacturing a radiation window for an X-ray measurement apparatus, an etch stop layer is first produced on a polished surface of a carrier. A thin film deposition technique is used to produce a boron carbide layer on an opposite side of the etch stop layer than the carrier. The combined structure including the carrier, the etch stop layer, and the boron carbide layer is attached to a region around an opening in a support structure with the boron carbide layer facing the support structure. The middle area of carrier is etched away, leaving an additional support structure.

13 Claims, 2 Drawing Sheets

(51) Int. Cl.
  *B23K 1/00*    (2006.01)
  *B23K 35/26*   (2006.01)
  *C23C 14/06*   (2006.01)
  *C23C 14/28*   (2006.01)
  *C23C 14/34*   (2006.01)
  *C23C 14/58*   (2006.01)
  *C23C 16/32*   (2006.01)
  *C23C 16/50*   (2006.01)
  *C23C 16/56*   (2006.01)
  *C23C 28/00*   (2006.01)
  *H01L 31/18*   (2006.01)
  *H01L 31/08*   (2006.01)

(52) U.S. Cl.
  CPC .......... *C23C 14/0635* (2013.01); *C23C 14/28* (2013.01); *C23C 14/34* (2013.01); *C23C 14/5873* (2013.01); *C23C 16/32* (2013.01); *C23C 16/50* (2013.01); *C23C 16/56* (2013.01); *C23C 28/32* (2013.01); *H01J 5/18* (2013.01); *H01L 31/1896* (2013.01); *H01J 2235/183* (2013.01); *H01L 31/085* (2013.01)

(58) Field of Classification Search
  CPC ............. H01J 2235/183; H01J 2237/00; H01J 2237/16; H01J 2237/164; B23K 1/00; B23K 1/0008; B23K 1/14; B23K 1/18; B23K 1/20; C23C 14/00; C23C 14/02; C23C 14/024; C23C 14/025; C23C 14/028; C23C 14/06; C23C 14/0641; C23C 14/0647; C23C 14/0652; C23C 14/067; C23C 14/0682; C23C 14/14; C23C 14/16; C23C 14/165; C23C 14/22; C23C 14/228; C23C 14/34; C23C 16/00; C23C 16/02; C23C 16/0254; C23C 16/0272; C23C 16/0281; C23C 16/06; C23C 16/24; C23C 16/28; C23C 16/30; C23C 16/32; C23C 16/325; C23C 16/38; C23C 16/42; C23C 16/44; C23C 16/4418; C23C 16/50; C23C 16/513; C23C 16/515; C23C 16/56; C23C 30/00; C23C 30/005; C23C 28/00; C23C 28/30; C23C 28/34; C23C 28/341; C23C 28/36; C23C 28/40; C23C 28/42
  See application file for complete search history.

(56) References Cited

U.S. PATENT DOCUMENTS

| | | | |
|---|---|---|---|
| 4,608,326 A * | 8/1986 | Neukermans | G03F 1/22 378/35 |
| 4,862,490 A | 8/1989 | Kamezo et al. | |
| 5,090,046 A * | 2/1992 | Friel | H01J 47/004 250/385.1 |
| 5,317,618 A * | 5/1994 | Nakahara | B01J 19/125 252/587 |
| 6,002,202 A | 12/1999 | Meyer et al. | |
| 8,498,381 B2 * | 7/2013 | Liddiard | H01J 35/18 378/161 |
| 2009/0086923 A1 | 4/2009 | Davis et al. | |
| 2009/0173897 A1 | 7/2009 | Decker et al. | |
| 2013/0270446 A1 * | 10/2013 | Dardona | G01N 27/64 250/382 |
| 2015/0303024 A1 * | 10/2015 | Harker | B81B 3/0078 378/161 |

FOREIGN PATENT DOCUMENTS

| | | |
|---|---|---|
| WO | 2004025682 A1 | 3/2004 |
| WO | 2011151505 | 12/2011 |

OTHER PUBLICATIONS

Oct. 16, 2017, FI communication issued for related FI application No. 20155881.
European Search Report EP16200720 dated Apr. 5, 2017.

* cited by examiner

METHOD FOR MANUFACTURING RADIATION WINDOW AND A RADIATION WINDOW

TECHNICAL FIELD

The invention concerns generally the technology of thin foils that are used as such or as a part of a radiation window in a measurement apparatus. Especially the invention concerns a method for manufacturing a thin boron carbide-based window foil, and a window foil manufactured with such method.

BACKGROUND OF THE INVENTION

A radiation window is a part of a measurement apparatus that allows a desired part of electromagnetic radiation to pass through. In many cases the radiation window must nevertheless be gastight, in order to seal and protect an enclosure where reduced pressure and/or a particular gas contents prevail. In order to cause as little absorption as possible of the desired radiation, a major part of the radiation window should consist of a thin foil. Typically the window foil is attached to a housing of the measurement apparatus by gluing. However, gluing does not provide a helium-tight junction between the window foil and the housing of the measurement apparatus.

Beryllium is known as a very good material for radiation window foils especially in X-ray measurement apparata, because it has a low atomic number (4) and consequently exhibits very low absorption of X-rays. Another characteristic of beryllium that makes it very useful for radiation window foils is its exceptional flexural rigidity. The thinnest beryllium foils that are commercially available for use in radiation windows at the time of writing this description have a thickness in the order of 8 micrometers. According to prior art, the beryllium foil is manufactured from an ingot by rolling. Various coatings can be applied to the beryllium foil for example to enhance its gastightness and corrosion resistance as well as to keep undesired parts of the electromagnetic spectrum (such as visible light) from passing through the foil. An example of known radiation window foils is the DuraBeryllium foil available from Moxtek Inc., Orem, Utah, USA. It comprises an 8 micrometers thick beryllium foil coated with a DuraCoat coating. DuraBeryllium, DuraCoat, and Moxtek are registered trademarks of Moxtek Incorporated.

At the time of writing this description it appears that the rolling technology has met its limits in the sense that it has not been shown capable of manufacturing beryllium foils thinner than 8 micrometers so that they would still be sufficiently gastight. This phenomenon is associated with the relatively large grain size (larger than foil thickness), which results from the grain structure of the original beryllium ingot. Grain boundaries in the beryllium foil tend to cause gas leaks through the foil. Additionally beryllium has disadvantages as a material because it is toxic. This brings additional requirements for the manufacturing process. Also, the future in the utilization of beryllium is uncertain due to tightening requirements by different national authorities.

Thus, there is a need to mitigate the aforementioned problems and develop a solution for providing a thin and gastight radiation window.

SUMMARY OF THE INVENTION

An objective of the present invention is to produce a radiation window foil that is thin, has good tensile strength, and absorbs very little X-rays. Another objective of the invention is to produce a gastight radiation window foil. Yet another objective of the invention is to produce a very thin radiation window foil that can be attached to a support structure of the radiation window without sacrificing the evenness of the foil. Yet another objective of the invention is to present a method for manufacturing a radiation window foil that fulfils the objectives mentioned above.

The objectives of the invention are achieved by using an etchable carrier, covering a surface of the etchable carrier with an etch stop layer, and by forming a boron carbide layer on top of said etch stop layer. This structure can be attached to a support structure with a solder, after which the etchable carrier can be at least partly etched away to leave only an additional support structure formed by the remaining part of the carrier and a foil comprising the boron carbide and etch stop layers.

A method according to the invention is characterised by the features of the characterising part of the independent claim directed to a method.

The invention applies also to a radiation window, the characteristic features of which are described in the characterising part of the respective independent claim.

According to an aspect of the invention, there is used a temporary carrier that should fulfil two criteria: it must be possible to polish a surface of the carrier very even, and the carrier must be etchable. Among possible materials for the carrier are silicon and other semiconductor substrates, which are readily available and routinely handled in sufficient quantities and degrees of surface evenness in the integrated circuit industry. Certain metals and other solid materials, such as cop-per and glass, are also possible. On a polished surface of the carrier, an etch stop layer is formed, and (either directly or indirectly) on top of the etch stop layer there is formed a boron carbide layer using a thin film deposition technique that allows growing the boron carbide layer to the desired thickness.

The carrier allows handling the thin layers of the manufactured radiation window foil with relative ease. The combination is soldered to a region around an opening in a support structure with said boron carbide layer facing said support structure. The solder may be implemented with indium. When the attachment is ready, the middle area of carrier is etched away forming an additional support structure, so that the layered radiation window foil remains and covers the opening in the support structure. The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

DETAILED DESCRIPTION OF THE INVENTION AND ITS EMBODIMENTS

In this description we use the following vocabulary. A layer means a quantity of essentially homogeneous material that by its form has much larger dimensions in two mutually orthogonal directions than in the third orthogonal direction. In most cases of interest to the present invention, the dimension of a layer in said third orthogonal direction (also referred to as the thickness of the layer) should be constant, meaning that the layer has uniform thickness. A foil is a structure, the form of which may be characterised in the same way as that of a layer (i.e. much larger dimensions in two mutually orthogonal directions than in the third orthogonal direction) but which is not necessarily homogeneous: for example, a foil may consist of two or more layers placed and/or attached together. A mesh is a special case of a layer or foil, in which the constituents do not make up a continuous piece of material but define an array of (typically regular, and regularly spaced) openings. A radiation window foil is a foil that has suitable characteristics (low absorption, sufficient gastightness, sufficient mechanical strength etc.) for use in a radiation window of a measurement apparatus. A radiation window is an entity the comprises a piece of radiation window foil attached to an annular support structure so that electromagnetic radiation may pass through an opening defined by the support structure without having to penetrate anything else than said piece of radiation window foil.

Figure 1:
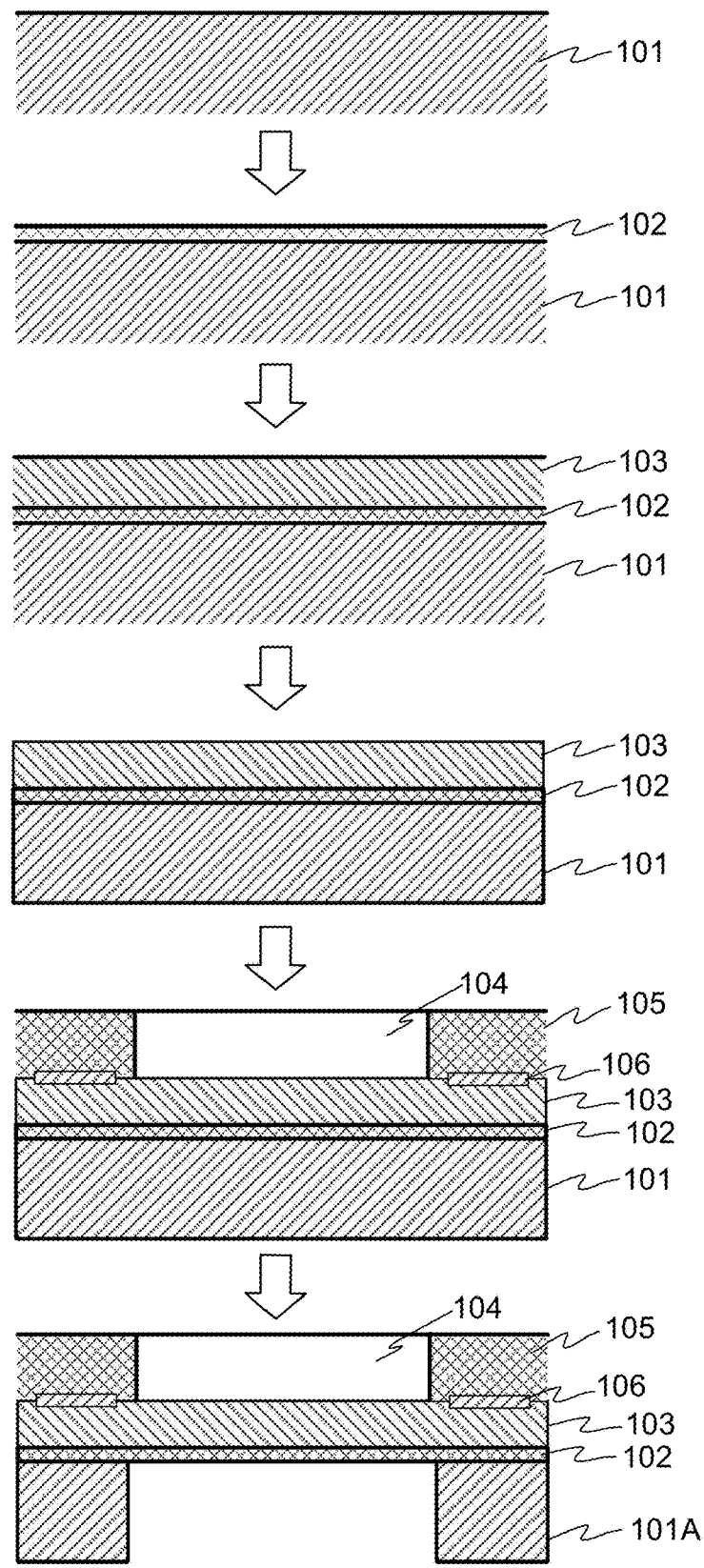
FIG. 1 illustrates a method and a radiation window according to an embodiment of the invention.

FIG. 1 illustrates a workpiece in various steps of a method for manufacturing a radiation window according to an embodiment of the invention. The topmost step illustrates a carrier 101, at least one surface of which has been polished. In FIG. 1, the polished surface faces upwards. The required smoothness of the polished surface is determined by the aim of covering it with an essentially continuous etch stop layer with uniform thickness in the order of 20 to 200 nanometers. As an example, silicon wafers are routinely polished to achieve rms (root mean square) roughness values in the order of fractions of a nanometer, which is a sufficient for the purposes of the present invention. In addition or as alternative to silicon, the carrier 101 may be manufactured from some other solid material that is etchable with some reasonably common and easily handled etching agent and that can be polished to the required level of smoothness.

In the next step an etch stop layer 102 is produced on the polished surface of the carrier 101. The main objective of the etch stop layer 102 is to keep an etching agent, which in a later process step will appear from below and remove at least part of the carrier 101, from affecting those layers that come on top of the etch stop layer 102. Therefore the material for the etch stop layer 102 should be selected so that it will not be affected to any significant degree by an etching agent that works effectively on the material of the carrier 101. Additionally the material of the etch stop layer 102 should be applicable for deposition in thin layers (in the order of 20 to 200 nanometers), and it should neither significantly absorb radiation nor produce any awkwardly handled anomalies at the wavelengths of electromagnetic radiation at which the radiation window is to be used. Further advantageous characteristics of an etch stop layer include corrosion resistance against environ-mental conditions during the use of an X-ray measurement apparatus, and good adhesion properties for further layers to be deposited thereon. If the carrier 101 is made of silicon, one advantageous material for the etch stop layer 102 is silicon nitride. The deposition of the etch stop layer 102 should take place as uniformly as possible, especially avoiding any remaining pinholes in the etch stop layer. Suitable methods for depositing the etch stop layer 102 include, but are not limited to, chemical vapour deposition and pulsed laser deposition.

In the next step of the method illustrated in FIG. 1 a thin film deposition technique is used to produce a boron carbide layer 103 on an opposite side of the etch stop layer 102 than the carrier 101. Advantageously the thickness of the boron carbide layer 103 is between 1 and 5 micrometers, and most advantageously between 1 and 3 micrometers. If the boron carbide layer was thinner, its mechanical strength would be so low that the need for additional support solutions could easily mitigate the positive effects of the present invention. If the boron carbide layer was thicker, its absorption might be too high to perform very sensitive X-ray fluorescence measurements, like the detection of sodium.

Also the boron carbide layer 103 should be made as even and as pinhole-free as possible. An important difference to the prior art methods, where a beryllium layer was produced mechanically by rolling from an ingot, is the production of the boron carbide layer 103 with a thin film deposition process, which typically will result in a much smaller grain size. Selecting the thickness of the layer to be produced at the accuracy of nanometers or tens of manometers is easily achieved in many thin film deposition methods. Suitable methods for producing the boron carbide layer 103 include, but are not limited to, sputtering, plasma assisted chemical vapour deposition, and pulsed laser deposition.

In the next step the combined structure of the carrier 101, the etch stop layer 102 and the boron carbide layer 103 is cut into pieces, so that a piece is suitably sized for use in one radiation window. As an example, the carrier might have originally been a silicon wafer with a diameter of several inches, while the diameter of a piece sufficient for a radiation window may be between 1 and 2 centimeters. On the other hand the invention does not limit the maximum size of a radiation window to be made. As another example, a radiation window according to an embodiment might have 50 millimeters as the diameter of the foil-covered opening for the radiation to pass through. Cutting the combined structure into pieces at this step of the method is not an essential requirement of the invention, but it is advantageous in the sense that a larger number of completed radiation windows can be very practically manufactured from a single original workpiece.

In the next step the piece of the combined structure comprising the carrier 101, the etch stop layer 102, and the boron carbide layer 103 is attached to an annular region around an opening 104 in a support structure 105, with the boron carbide layer 103 facing the support structure 105. For the attachment for example soldering can be used; the cross-section of an exaggeratedly thick layer of solder 106 is schematically shown in FIG. 1. Also otherwise we may note that the illustrated dimensions are not to scale and not comparable to each other; they have been selected only for graphical clarity in the drawings. In order to achieve helium-tight radiation window preferably soldering is used for the attachment. If helium-tightness is not needed also gluing may be used for the attachment. The solder 106 material may be indium. The thickness of the solder 106 may be, e.g., from 10 to 100 micrometers. The fact that the carrier 101 is still present at the step of attaching those parts to the support structure that eventually will constitute the radiation window foil means that handling is easy and there is no need to worry about wrinkling or other kinds of deformation of the radiation window foil at this stage. The illustration of the solder 106 is only schematic in FIG. 1, and it does not mean that a flat layer of solder on the planar surface between the support structure 105 and the boron carbide layer 103 would be the only possible alternative.

According to an embodiment of the invention the surfaces of the support structure 105 and the boron carbide layer 103 to which the solder 106 is arranged may be gold-plated before soldering to improve the contact between the solder 106 and the support structure 105 and the contact between the solder 106 and the boron carbide layer 103.

The descriptor "annular" should be understood in a wide sense. The invention does not require the support structure to have e.g. a circular form. It is sufficient that the support structure offers some edges and/or a region around the opening, to which the radiation window foil can be attached tightly and extensively enough to keep the radiation window foil in the completed structure securely in place, and—in those applications where gastightness is required—to form a gastight seal.

In the last step illustrated in FIG. 1 the middle area of the carrier 101 has been etched away, leaving only an annular additional support structure 101A formed by the remaining part of the carrier 101 and a radiation window foil comprising the etch stop layer 102 and the boron carbide layer 103 to cover the opening 104 in the support structure 105. The additional support structure 101A provides additional support for the solder 106 in order to make the junction between the support structure 105 and the combined structure more robust. The additional support structure 101A does not disturb the desired part of electromagnetic radiation to pass through the radiation window or cause more unwanted absorption or spurious responses, because the additional support structure 101A does not extend to the middle of the radiation window, wherein the opening 104 in the support structure 105 resides. This phase of the method underlines the denomination of the etch stop layer 102. Etching is considered to be the most advantageous way of carefully removing the middle area of the carrier 101 while leaving the other layers intact. As an example, if the carrier 101 is made of silicon and the etch stop layer 102 is made of silicon nitride, potassium hydroxide (KOH) is one suitable etching agent, especially at a slightly elevated temperature like 70 degrees centigrade. Alternatively or in addition, plasma etching may be used. Furthermore, a combination of KOH etching and plasmaetching may also be used. In the etching stage it should be ensured that the etching agent only affects the side of the radiation window foil where the etch stop layer 102 exists. In doing so the support structure 105 can be utilized: for example, one may turn the structure so that the carrier faces upwards, and attach one end of a tubular shield to outer edges of the support structure 105, so that a "cup" is formed with the carrier-covered radiation window foil forming the bottom of the cup. The tubular shield will keep the etching agent poured into the cup from affecting other parts of the structure than the carrier.

After etching away the middle area of the carrier, post-processing steps such as rinsing, drying, and testing may be applied according to need.

Figure 2:
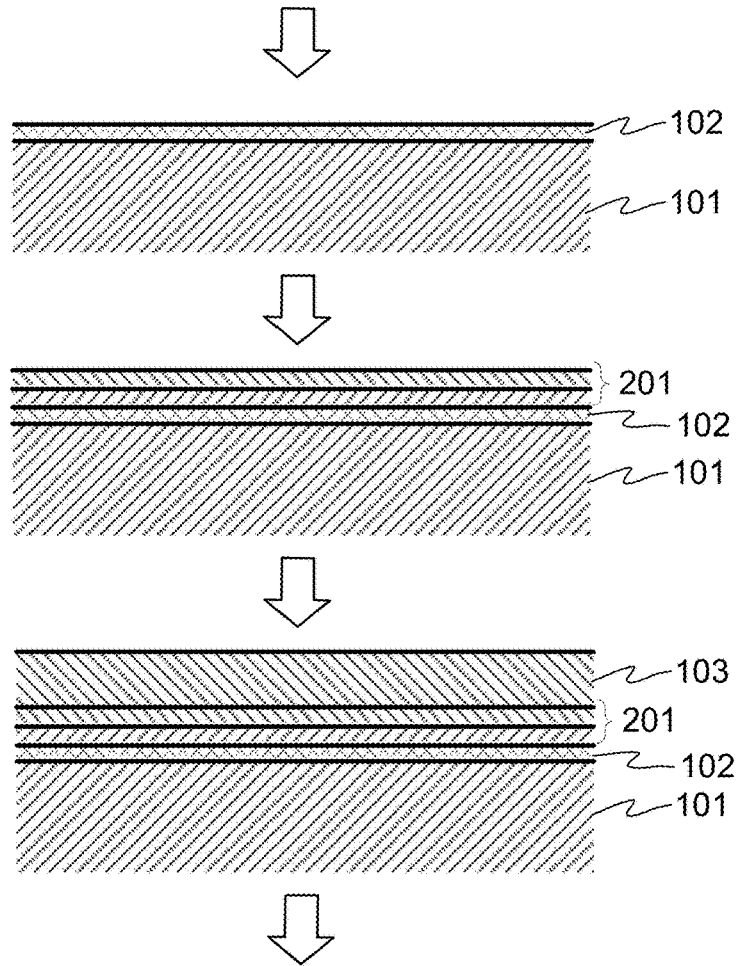
FIG. 2 illustrates a method and a radiation window according to another embodiment of the invention.

FIG. 2 illustrates an optional addition to the basic method described above in association with FIG. 1. In the topmost illustrated step of FIG. 2, the etch stop layer 102 has been produced on a polished surface of the carrier 101. As the next step in FIG. 2 one or more diffusion barrier layers are produced on the etch stop layer 102. Together the one or more diffusion barrier layers constitute a layered diffusion barrier 201. One possible layered diffusion barrier of this kind is the so-called layered superbarrier, which consists of alternating aluminium oxide ($Al_2O_3$) and titanium oxide ($TiO_2$) layers. For example, in the middle step illustrated in FIG. 2 the formation of a layered diffusion barrier 201 may begin by depositing a 5 nanometers layer of titanium oxide, followed by a 20 nanometers layer of aluminium oxide, after which these deposition steps are repeated one after the other until the total thickness of the layered diffusion barrier 201 is in the order of 100 nanometers. This example is by no means limiting, and several other approaches may also be taken to produce the layered diffusion barrier 201. Any deposition method can be used; for example atomic layer deposition has been reported to work well in the production of this kinds of layered structures.

The lowest step illustrated in FIG. 2 represents using a thin film deposition technique to produce a boron carbide layer 103. Although there is now the layered diffusion barrier 201 in between, the boron carbide layer 103 is still on an opposite side of the etch stop layer 102 than the carrier 101, which is important taken that at least part of the carrier 101 should later be removed in an etching process the effect of which should end at the etch stop layer 102. From this step the method of manufacturing a radiation window continues to cutting the radiation window foil into size for radiation window(s), like in the fourth step of FIG. 1.

Figure 3:
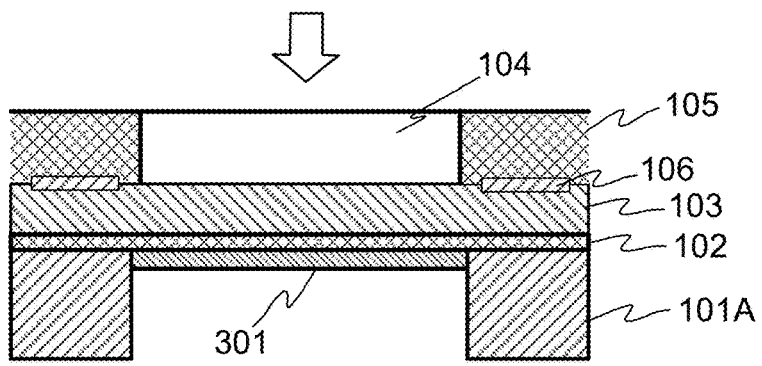
FIG. 3 illustrates a method and a radiation window according to yet another embodiment of the invention.

FIG. 3 illustrates yet another optional addition that can be added to any of the methods described above. According to FIG. 3, after etching away the middle area of the carrier, there is produced one or more additional layers 301 on the exposed etch stop layer 102. For example, if the boron carbide layer 103 that has been described so far is called a first boron carbide layer, the radiation window may comprise a second boron carbide layer as the additional layer 301 on an opposite side of the etch stop layer 102 than said first boron carbide layer 103. Using a second boron carbide layer may be advantageous especially to enhance the mechanical strength of the radiation window. The additional layer 301 may also be an aluminium layer, which would have a role in blocking out unwanted wavelengths of electromagnetic radiation, such as visible light. An aluminium layer and/or other layers could also be produced on that side of the first boron carbide layer 103 that will face the support structure 105, before making the attachment.

Exemplary thin film deposition techniques for producing the layers mentioned above have already been considered. As a subgenus of pulsed laser deposition, cold ablation is a promising candidate for producing any of the layers. Cold ablation means that the laser pulses used to remove material from a target (which removed material will hit the surface on which the thin film is to be deposited) are so short, in the order of picoseconds or shorter, that there is insufficient time for the energy delivered by the laser pulse to be transferred as heat to the target material. Essentially all energy of the laser pulse will be turned into kinetic energy of the outflying plasma, and the target is not heated considerably—hence the name cold ablation. The plasma that is produced in cold ablation is very homogeneous in the sense that it comprises very few—if any—larger fragments of the target material that could cause pinholes in the layer to be produced.

Advantages of the invention include the possibility of manufacturing radiation windows where the radiation window foil is very thin and yet gastight, and causes very little unwanted absorption or spurious responses in a measurement involving X-rays. Additionally, boron carbide is not toxic and it is environmentally sustainable also in the long term. Furthermore, gas leakage through the window foil caused by grain boundaries in the foil is not a problem, when a boron carbide radiation window is used.

We claim:

1. A method for manufacturing a radiation window for an X-ray measurement apparatus, comprising:
    producing an etch stop layer on a polished surface of a carrier,
    using a thin film deposition technique to produce a first boron carbide layer on an opposite side of said etch stop layer than said carrier,
    soldering the combined structure comprising said carrier, said etch stop layer, and said first boron carbide layer to a region around an opening in a support structure with said first boron carbide layer facing said support structure,
    etching away the middle area of said carrier forming an additional support structure, and
    after etching away the middle area of said carrier, producing a second boron carbide layer as an additional layer on the exposed etch stop layer on an opposite side of the etch stop layer than said first boron carbide layer.

2. The method according to claim 1, wherein said carrier is a silicon wafer.

3. The method according to claim 1, wherein said thin film deposition technique comprises at least one of the following: sputtering, plasma assisted chemical vapour deposition, pulsed laser deposition.

4. The method according to claim 1, wherein said combined structure is soldered to said region with a solder.

5. The method according to claim 4, wherein the solder is implemented with indium.

6. The method according to claim 4, further comprising:
    producing a gold-plating on the surfaces of the support structure and the first boron carbide layer to which the solder is arranged.

7. The method according to claim 1, further comprising:
    producing one or more diffusion barrier layers on said etch stop layer, so that said thin film deposition technique is used to produce said first boron carbide layer on top of said one or more diffusion barrier layers.

8. A radiation window for an X-ray measurement apparatus, comprising:
    a support structure that defines an opening, and
    stretched across said opening a layered window foil that is soldered to the support structure at a region around said opening;
    wherein said layered window foil comprises a first boron carbide layer manufactured by a thin film deposition technique, an etch stop layer on an opposite side of said first boron carbide layer than said support structure, and an additional support structure on an opposite side of said etch stop layer than said first boron carbide layer, and
    wherein the radiation window comprises a second boron carbide layer on an opposite side of said etch stop layer than said first boron carbide layer.

9. The radiation window according to claim 8, further comprising a layered diffusion barrier between said first boron carbide layer and said etch stop layer.

10. The radiation window according to claim 8, further comprising an aluminum layer.

11. The radiation window according to claim 8, wherein the first boron carbide layer between the support structure and the etch stop layer is between 1 and 5 micrometers thick.

12. The radiation window according to claim 8, wherein the etch stop layer is made of silicon nitride and is between 20 and 200 nanometers thick.

13. The radiation window according to claim 8, wherein the first boron carbide layer between the support structure and the etch stop layer is between 1 and 3 micrometers thick.

\* \* \* \* \*